United States Patent
Namkung et al.

(10) Patent No.: US 9,299,755 B2
(45) Date of Patent: Mar. 29, 2016

(54) FLEXIBLE DISPLAY APPARATUS CONFIGURED TO BE BENT

(71) Applicant: SAMSUNG DISPLAY CO., LTD., Yongin, Gyeonggi-Do (KR)

(72) Inventors: Jun Namkung, Asan-si (KR); Soonryong Park, Sejong (KR); Chulwoo Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/231,400

(22) Filed: Mar. 31, 2014

(65) Prior Publication Data

US 2015/0091012 A1    Apr. 2, 2015

(30) Foreign Application Priority Data

Sep. 30, 2013 (KR) .......................... 10-2013-0116602

(51) Int. Cl.
*H01L 27/32* (2006.01)
*G09G 3/34* (2006.01)
(Continued)

(52) U.S. Cl.
CPC .......... *H01L 27/3262* (2013.01); *G09G 3/3208* (2013.01); *G09G 3/34* (2013.01); *H01L 27/3276* (2013.01); *H01L 51/0097* (2013.01); *G09G 2330/04* (2013.01); *G09G 2380/02* (2013.01); *H01L 2251/5338* (2013.01)

(58) Field of Classification Search
CPC ................ H01L 27/1214; H01L 27/12; H01L 29/66757
USPC ........................................................... 257/72
See application file for complete search history.

(56) References Cited

U.S. PATENT DOCUMENTS

| 2007/0012489 A1* | 1/2007 | Kim et al. | 178/18.01 |
| 2012/0218219 A1* | 8/2012 | Rappoport et al. | 345/174 |
| 2013/0076268 A1* | 3/2013 | Choi et al. | 315/312 |

(Continued)

FOREIGN PATENT DOCUMENTS

| JP | 2009-218468 | 9/2009 |
| JP | 2011-237661 | 11/2011 |

(Continued)

OTHER PUBLICATIONS

Korean Patent Abstracts Publication No. KR 10-2006-0059745 A, dated Jun. 2, 2006, for KR 10-0700644, 2 pages.

(Continued)

*Primary Examiner* — Michael Jung
*Assistant Examiner* — Charles R Peters
(74) *Attorney, Agent, or Firm* — Lewis Roca Rothgerber Christie LLP

(57) ABSTRACT

A display apparatus includes: a flexible display panel including: a base substrate including a display area and a non-display area; a pixel at the display area of the base substrate; and signal lines at the non-display area of the base substrate; and a protective film coupled to the flexible display panel and including: a first portion under the flexible display panel; and a second portion extending from the first portion and configured to be bent to overlap with the signal lines and to overlap with the first portion, wherein the display apparatus is configured to be bent along a folding line crossing an area of the display apparatus in which the first portion and the second portion are configured to be overlapped with each other.

11 Claims, 12 Drawing Sheets

(51) Int. Cl.
*H01L 51/00* (2006.01)
*G09G 3/32* (2006.01)

(56) References Cited

U.S. PATENT DOCUMENTS

2014/0126228 A1* 5/2014 Lee et al. .................. 362/382
2014/0240985 A1* 8/2014 Kim et al. ................ 362/249.04

FOREIGN PATENT DOCUMENTS

| | | |
|---|---|---|
| JP | 2012-128006 | 7/2012 |
| KR | 10-0700644 | 3/2007 |
| KR | 10-0747275 | 8/2007 |
| KR | 10-2013-0004085 | 1/2013 |
| KR | 10-1320385 | 10/2013 |

OTHER PUBLICATIONS

Korean Patent Abstracts Publication No. KR 10-2007-0055931 A, dated May 31, 2007, for KR 10-0747275, 2 pages.
Korean Patent Abstracts Publication No. KR 10-2013-0007312 A, dated Jan. 18, 2013, for KR 10-1320385, 2 pages.

* cited by examiner

FLEXIBLE DISPLAY APPARATUS CONFIGURED TO BE BENT

CROSS-REFERENCE TO RELATED APPLICATION

This application claims priority to and the benefit of Korean Patent Application No. 10-2013-0116602, filed on Sep. 30, 2013, the contents of which are hereby incorporated by reference in their entirety.

BACKGROUND

1. Field

Embodiments of the present invention relate to a display apparatus.

2. Description of the Related Art

In recent years, a flexible display apparatus, which maintains a relatively stable display performance even though it may be bent or flexed like paper, has been actively researched and developed using a flexible material, such as plastic. The flexible display apparatus has been in the spotlight as a next generation display apparatus to replace a mobile computer, an electronic newspaper, a smart card, and printed media, such as books, newspapers, and magazines.

The flexible display apparatus includes a flexible display panel. The flexible display panel includes a display area for displaying an image and may include a non-display area surrounding the display area. The non-display area may include various circuit and line parts to apply an image signal to the display area and these components may be located on the same plane surface as the display area.

When the flexible display panel is bent to an opposite direction to a direction in which the image is displayed in the non-display area or the display area, the area of the non-display area may be reduced. When the flexible display panel is bent, a crack may occur in the line part.

SUMMARY

Aspects of embodiments of the present invention provide a display apparatus capable of preventing or reducing the occurrence of a crack in a signal line thereof.

Embodiments of the present invention include a display apparatus including a base substrate including a display area and a non-display area; a pixel at the display area of the base substrate; and signal lines at the non-display area of the base substrate; and a protective film coupled to the flexible display panel and including: a first portion under the flexible display panel; and a second portion extending from the first portion and configured to be bent to overlap with the signal lines and to overlap with the first portion, wherein the display apparatus is configured to be bent along a folding line crossing an area of the display apparatus in which the first portion and the second portion are configured to be overlapped with each other.

The folding line may be parallel to a boundary line between the display area and the non-display area.

The folding line may cross the display area.

The second portion may include a first sub-portion and a second sub-portion, and the first portion may be between the first and second sub-portions and the first and second sub-portions may be configured to cover a corresponding pad of pads for the signal lines.

The pads for the signal lines may be gathered at one side of the non-display area.

The flexible display panel may further include: a data driver at a first side of the non-display area and configured to apply a data signal to the pixel; and a gate driver at a second side of the non-display area opposite the first side of the non-display area and configured to apply a driving signal to the pixel, and a first group of the signal lines may be coupled to the data driver, and a second group of the signal lines may be coupled to the gate driver.

The signal lines may be formed at a neutral surface and the first portion may be configured to be overlapped with the second portion.

The flexible display panel may further include: a display device layer including the pixel and located in the display area of the base substrate; and an optical film on the display device layer and overlapping the display area.

A neutral surface of the display area of the display apparatus may be at the display device layer.

The optical film may include at least one of a retardation film or a polarizing film.

According to the above, instances of the signal lines becoming cracked when the display apparatus is bent may be prevented or reduced.

BRIEF DESCRIPTION OF THE DRAWINGS

The above and other aspects of the present disclosure will become apparent by reference to the following detailed description when considered in conjunction with the accompanying drawings wherein.

DETAILED DESCRIPTION

Figure 1:
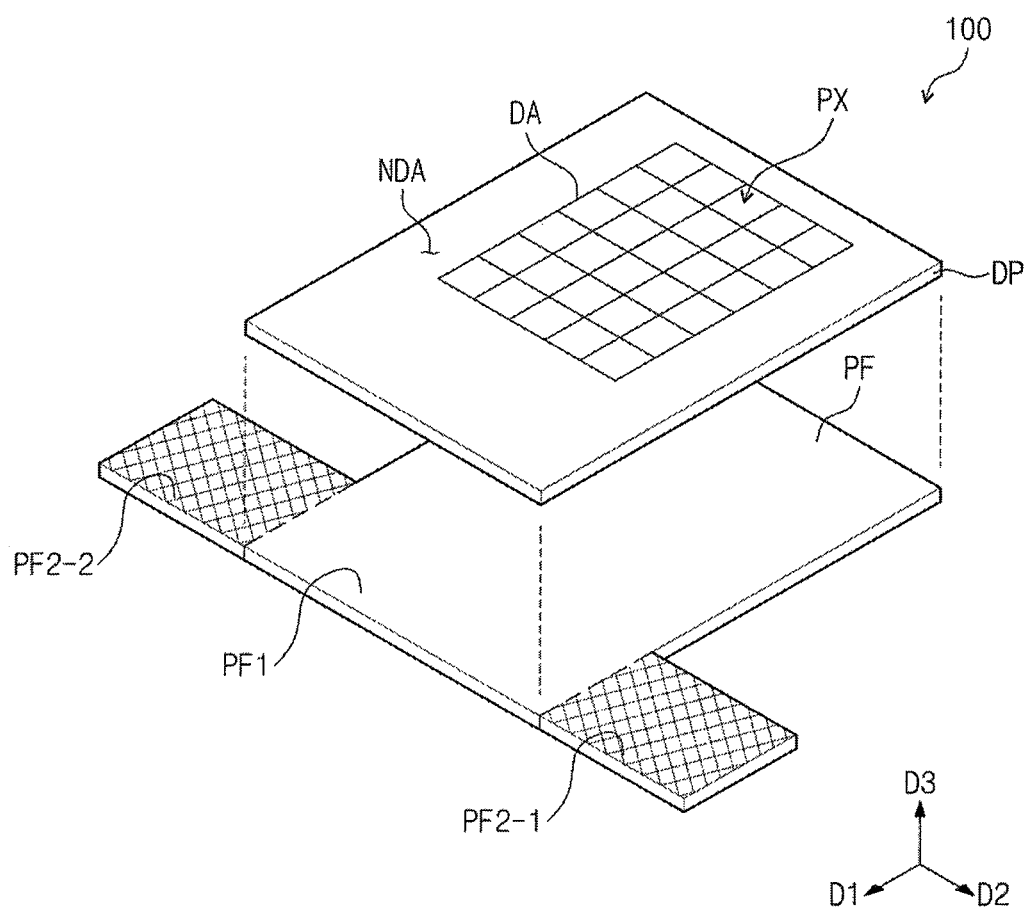
FIG. 1 is an exploded perspective view showing a display apparatus according to an example embodiment of the present disclosure.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to" or "directly coupled to" another element or layer, there are no intervening elements or layers present. Like reference numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," and "an" are intended to include the plural forms as well, unless the context clearly indicates otherwise. It will be further understood that the terms "includes" and/or "including", when used in this specification, specify the presence of stated features, integers, steps, operations, elements, components, and/or groups, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in some detail with reference to the accompanying drawings.

Figure 2:
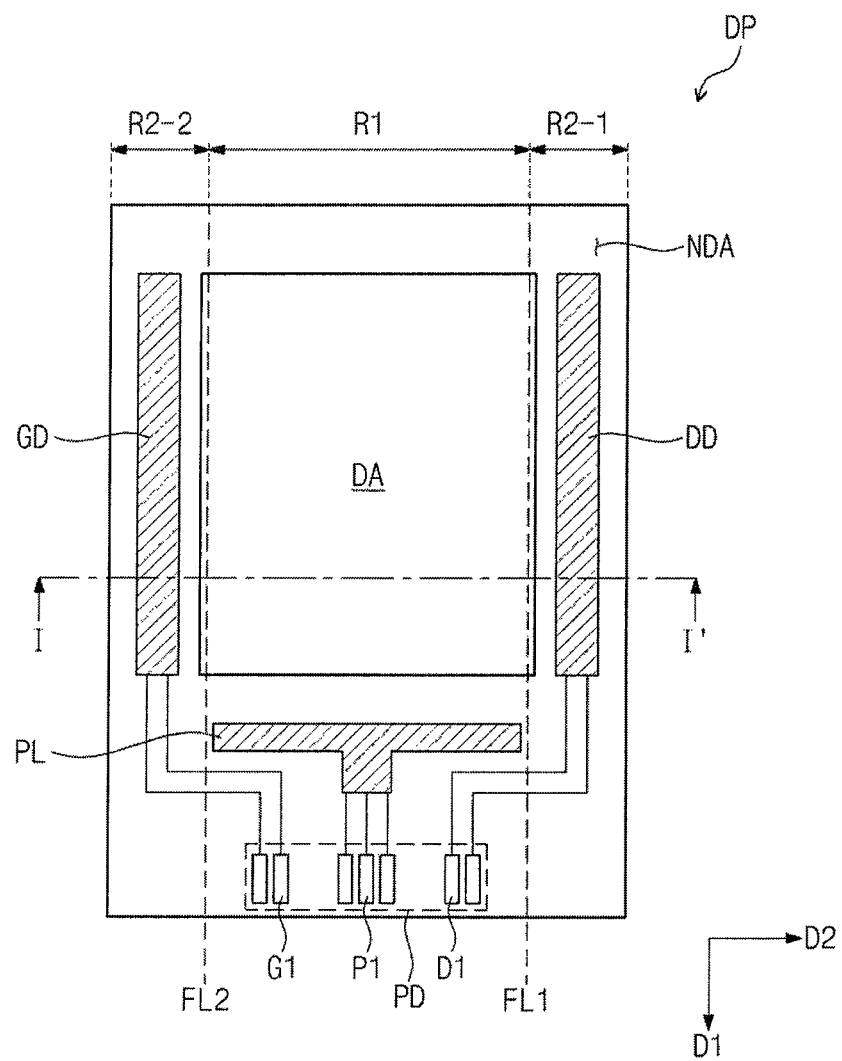
FIG. 2 is a plan view showing the display panel shown in FIG. 1.
Figure 3:
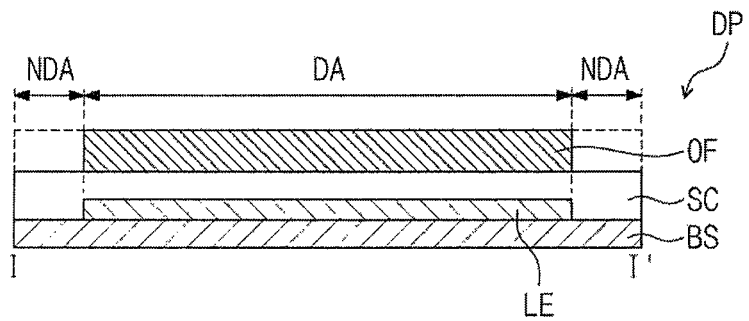
FIG. 3 is a cross-sectional view taken along the line I-I' of FIG. 2.
Figure 4:
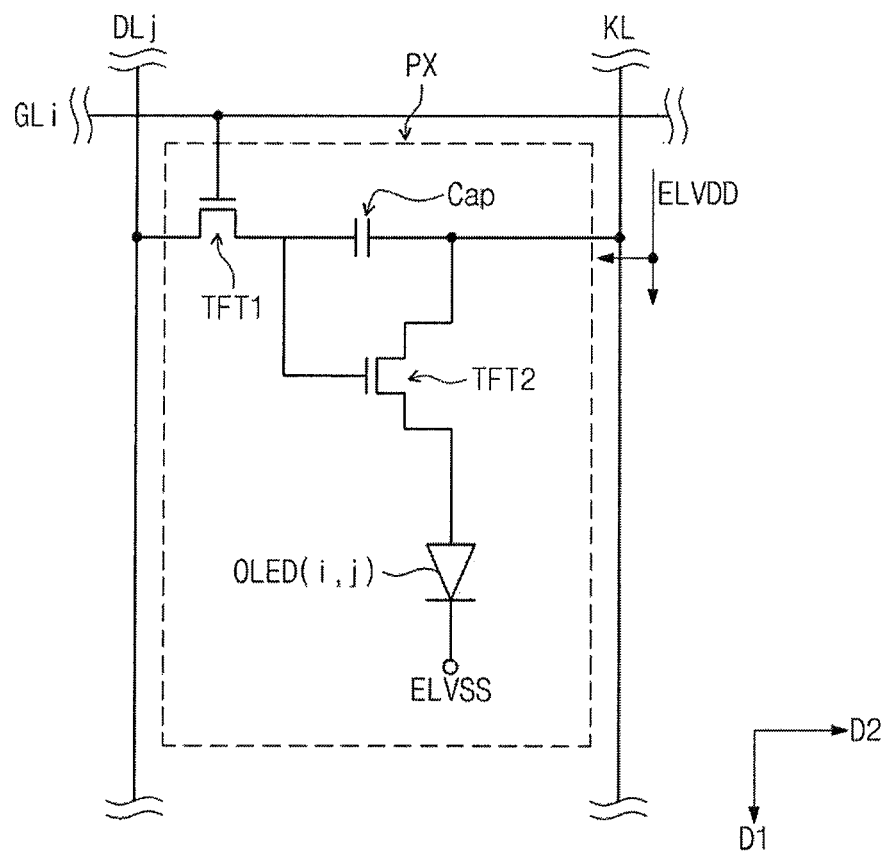
FIG. 4 is an equivalent circuit diagram showing a pixel.

FIG. 1 is an exploded perspective view showing a display apparatus according to an example embodiment of the present disclosure, FIG. 2 is a plan view showing a display panel shown in FIG. 1, FIG. 3 is a cross-sectional view taken along the line I-I' of FIG. 2, and FIG. 4 is an equivalent circuit diagram showing a pixel.

Hereinafter, the display apparatus 100 according to an example embodiment of the present disclosure will be described in some detail with reference to FIGS. 1 to 4.

In the present example embodiment, the display apparatus 100 may be one of various categories of display apparatuses, such as a liquid crystal display apparatus, an organic light emitting display apparatus, an electrophoretic display apparatus, an electrowetting display apparatus, a microelectromechanical system display apparatus, etc.

Referring to FIGS. 1 to 4, the display apparatus 100 includes a flexible display panel DP and a protective film PF located under the flexible display panel DP.

The flexible display panel DP includes a base substrate BS including a display area DA and a non-display area NDA, a pixel PX located in the display area DA of the base substrate BS, and signal lines located in the non-display area NDA of the base substrate BS.

Referring to FIG. 2, the flexible display panel DP may include a first region R1 including at least the display area DA and second regions R2-1 and R2-2 outside the first region R1 with reference to a first folding line FL1 and a second folding line FL2, which run along opposite edges of the display area DA. The second regions R2-1 and R2-2 are arranged at the non-display area NDA when viewed in a plan view.

The first and second folding lines FL1 and FL2 are parallel to a boundary line between the display area DA and the non-display area NDA and cross the signal lines and the display area DA. The display apparatus 100 may be bent along the first and second folding lines FL1 and FL2.

The first and second folding lines FL1 and FL2 are spaced apart from each other and are parallel (e.g., parallel or substantially parallel) to a first direction D1. The display area DA is positioned between the first and second folding lines FL1 and FL2, although the first and second folding lines FL1 and FL2 may overlap opposite edges of the display area DA.

For the convenience of explanation, the first folding line FL1 located at a right side of the display area DA in FIG. 2 is referred to as a first folding line FL1 and the second folding line FL2 located at a left side of the display area DA in FIG. 2 is referred to as a second folding line FL2. In addition, one region of the second regions R2-1 and R2-2, which is configured to be bent or flexed with respect to the first region R1 along the first folding line FL1, is referred to as a first sub-region R2-1, and the other region of the second regions R2-1 and R2-2, which is configured to be bent or flexed with respect to the first region R1 along the second folding line FL2, is referred to as a second sub-region R2-2.

The flexible display panel DP includes a gate driver GD, a data driver DD, a driving voltage line part (or driving voltage line) PL, and a pad part (or pad) PD at which end portions G1, D1, and P1 of signal lines of the gate driver GD, the data driver DD, and the driving voltage line part PL are arranged.

The pad part PD is located or arranged at one side of the display area DA in the first region R1.

A chip on film (not shown) having a thin film shape may be positioned or located on the pad part PD, on which a semiconductor chip may be directly mounted. The data driver DD is located in the first sub-region R2-1 and applies a data signal to the pixel PX. The data signal lines are located in the first sub-region R2-1 and the first region R1. The gate driver GD is located in the second sub-region R2-2 and applies a driving signal to the pixel PX. The gate signal lines are located in the second sub-region R2-2 and the first region R1. The driving voltage line part PL is located in the first region R1 to be adjacent to the pad part PD and applies a driving voltage to the pixel PX. However, the arrangements of the drivers and lines, which are located in the non-display area NDA, should not be limited to the above-mentioned arrangements.

Referring to FIGS. 1 and 2 again, the protective film PF is disposed under the flexible display panel DP to improve strength of the flexible display panel DP. The protective film PF may be formed of any suitable flexible material, such as polyethylene terephthalate (PET), polyethylene naphthalate (PEN), polycarbonate (PC), polypropylene (PP), etc., but it should not be limited thereto or thereby.

The protective film PF includes a first portion PF1 arranged under the flexible display panel DP in the first region R1 and the second regions R2-1 and R2-2 and second portions PF2-1 and PF2-2 extending from the first portion PF1. The second portions PF2-1 and PF2-2 are configured to include a first sub-portion PF2-1 extending to a right direction of the first portion PF1 and being located adjacent to the first sub-region R2-1 and a second sub-portion PF2-2 extending to a left direction of the first portion PF1 and being located adjacent to the second sub-region R2-2. The second portions PF2-1 and PF2-2 extend from the first portion PF1 and are configured to be bent or flexed to be positioned above at least portion of the signal lines.

Referring to FIGS. 2 and 3, the flexible display panel DP includes the base substrate BS, a display device layer LE positioned on the base substrate BS, and an optical film OF positioned on the display device layer LE.

The base substrate BS may be formed of any suitable substrate material (e.g., a plastic material) with a relatively high level of heat resistance and durability (e.g., polyethylene terephthalate (PET), polyethylene naphthalate (PEN), polycarbonate (PC), polyarylate (PAR), polyether imide (PEI), polyether sulfone (PES), polyimide (PI), etc., but it should not be limited thereto or thereby).

Although not shown in figures, the base substrate BS may include a first base portion (not shown) located in the first region R1 and a second base portion (not shown) located in the second regions R2-1 and R2-2. In addition, the base substrate BS may further include an auxiliary portion (not shown) extending from the second base portion and configured to be bent or flexed to overlap with the second portions PF2-1 and PF2-2.

The flexible display panel DP may further include a barrier layer between the base substrate BS and the display device layer LE. The barrier layer may include at least one of an inorganic layer or an organic layer. The barrier layer may prevent or reduce unnecessary substances or contaminants from entering the display area DA after passing through the base substrate BS.

The display device layer LE is positioned in the display area DA and includes at least one pixel PX. The pixel PX includes an organic light emitting device. In addition, the pixel PX includes at least one thin film transistor to control the organic light emitting device. The display device may be one of various categories of display devices, such as a liquid crystal display device, an electrophoretic device, etc.

As shown in FIG. 4, the pixel PX includes a first thin film transistor TFT1, a capacitor Cap, a second thin film transistor TFT2, and an organic light emitting device OLED. The first thin film transistor TFT1, the capacitor Cap, and the second thin film transistor TFT form a circuit part to control the organic light emitting device OLED.

The pixel PX is coupled to an i-th gate line GLi and a j-th data line DLj. The i-th gate line GLi and the j-th data line DLj are included in the above-mentioned signal lines located in the non-display area NDA. The i-th gate line GLi is coupled to the gate driver GD and the j-th data line DLj is coupled to the data driver DD.

The first thin film transistor TFT1 outputs the data signal applied to the j-th data line DLj in response to the gate signal applied to the i-th gate line GLi. The second thin film transistor TFT2 controls a driving current flowing through the organic light emitting device OLED in response to an amount of electric charges charged in the capacitor Cap. The pixel PX receives a first voltage ELVDD and a second voltage ELVSS, which have different voltage levels.

The organic light emitting device OLED includes a first electrode that receives a voltage corresponding to the first voltage ELVDD from the second thin film transistor TFT2 and a second electrode that receives the second voltage ELVSS. The organic light emitting device OLED emits a light during a turn-on period of the second thin film transistor TFT2. However, a configuration of the pixel PX should not be limited to the above-mentioned configuration.

The flexible display panel DP may further include a sealing member arranged on the display device layer LE to seal the display device layer LE. The sealing member may include a sealing thin layer SC having flexibility. The sealing thin layer SC may have a multi-layer structure of a plurality of inorganic insulating layers or inorganic and organic insulating layers.

The optical film OF is arranged or formed on the sealing thin layer SC. In this case, the optical film OF is arranged or formed to cover at least the display area DA. An adhesive (not shown) may be further deposited or formed between the sealing thin layer SC and the optical film OF.

The optical film OF includes at least one of a retardation film or a polarizing film. The retardation film has various functions, such as color compensation, viewing angle expansion, reflection prevention, etc., and the polarizing film provides a relatively uniform transmitted light quantity distribution and changes a color of the transmitted light.

The protective film PF is located under the base substrate BS and the adhesive (not shown) is further located between the base substrate BS and the protective film PF.

Figure 5:
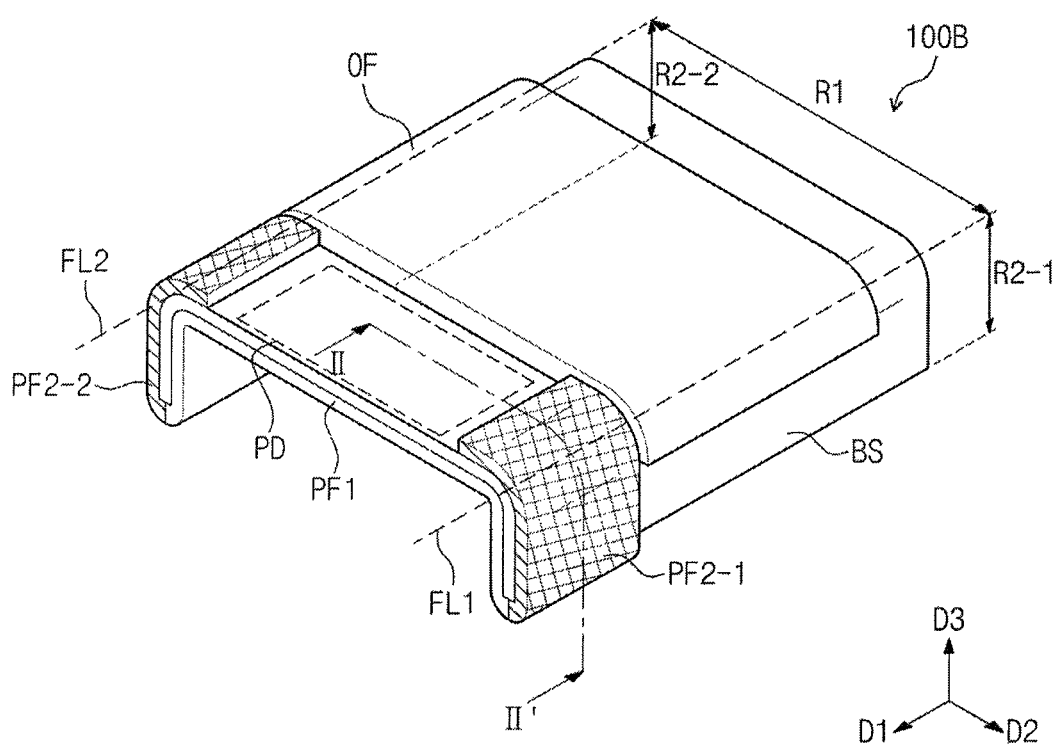
FIG. 5 is a perspective view showing a display apparatus according to an example embodiment of the present disclosure.
Figure 6A:
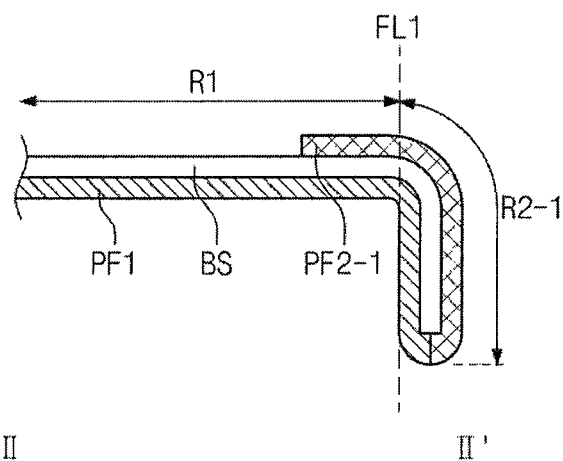
FIG. 6A is a cross-sectional view taken along the line II-II' of FIG. 5.
Figure 6B:
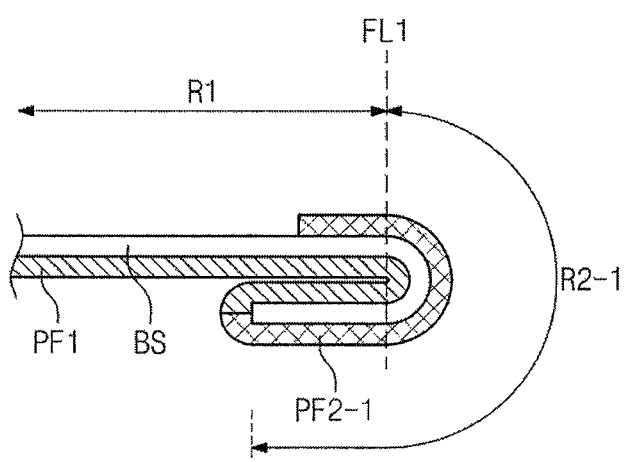
FIG. 6B is a cross-sectional view showing a protective film according to another example embodiment of the present disclosure.

FIG. 5 is a perspective view showing a display apparatus according to an example embodiment of the present disclosure, FIG. 6A is a cross-sectional view taken along the line II-II' of FIG. 5, and FIG. 6B is a cross-sectional view showing a protective film according to another example embodiment of the present disclosure.

Referring to FIG. 5, a display apparatus 100B is bent in an opposite direction with respect to a third direction D3 along the first and second folding lines FL1 and FL2. The first and second folding lines FL1 and FL2 respectively cross the portions at which the first portion PF1 of the protective film PF overlaps the second portions PF2-1 and PF2-2 of the protective film PF.

Hereinafter, for the convenience of explanation, the display apparatus 100B will be described with reference to the portion thereof bent with respect to the first folding line FL1.

Referring to FIGS. 5 and 6A, the first sub-portion PF2-1 of the protective film PF is located on the base substrate BS to overlap with the first portion PF1 of the protective film PF. In this case, the base substrate BS is located between the first sub-portion PF2-1 and the first portion PF1. Because the first sub-portion PF2-1 is located on the base substrate BS, the portion in which the first portion PF1 and the first sub-portion PF2-1 overlap with each other may have the same thickness as the portion in which the optical film OF is positioned on the base substrate BS. However, the thickness of the portion in which the first portion PF1 and the first sub-portion PF2-1 overlap with each other should not be limited thereto or thereby. That is, the thickness may be varied depending on the thickness of each of the protective film PF and the optical film OF.

In some embodiment, the display apparatus 100B is bent to allow the first region R1 and the first sub-region R2-1 to form an angle of about 90 degrees, but it should not be limited thereto or thereby. That is, the display apparatus 100B may be bent such that the first region R1 and the first sub-region R2-1 overlap with each other.

Referring to FIG. 6B, the first region R1 overlaps with the first sub-region R2-1, and thus the protective film PF2-1 located in the first sub-region R2-1 is positioned under and overlaps with the protective film PF1 located in the first region R1.

Therefore, the display apparatus 100B is bent to allow the first region R1 and the first sub-region R2-1 to form an angle in a range of about 10 degrees to about 180 degrees.

Figure 7:
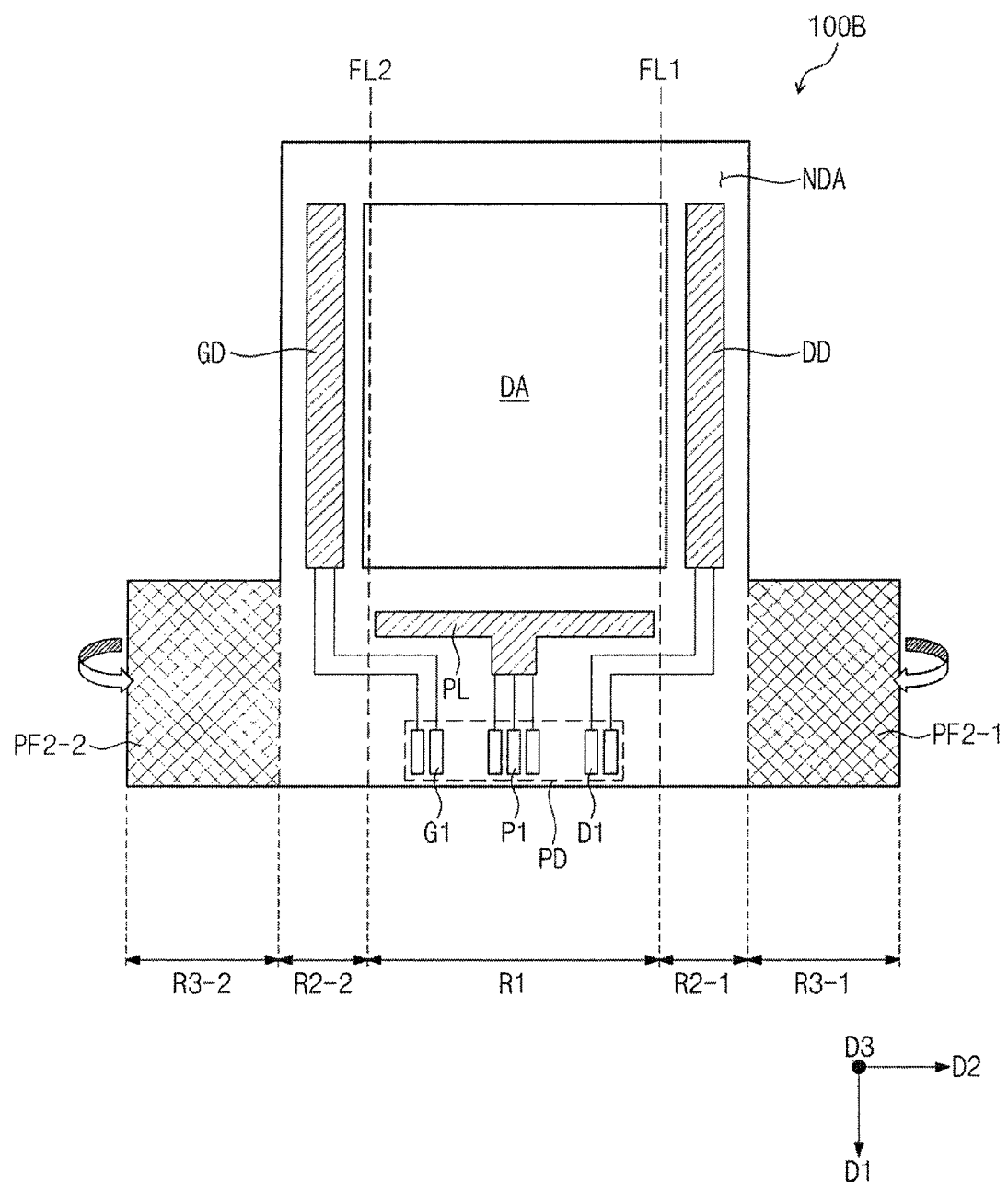
FIG. 7 is a plan view showing a display apparatus before a protective film shown in FIG. 5 is bent.
Figure 8A:
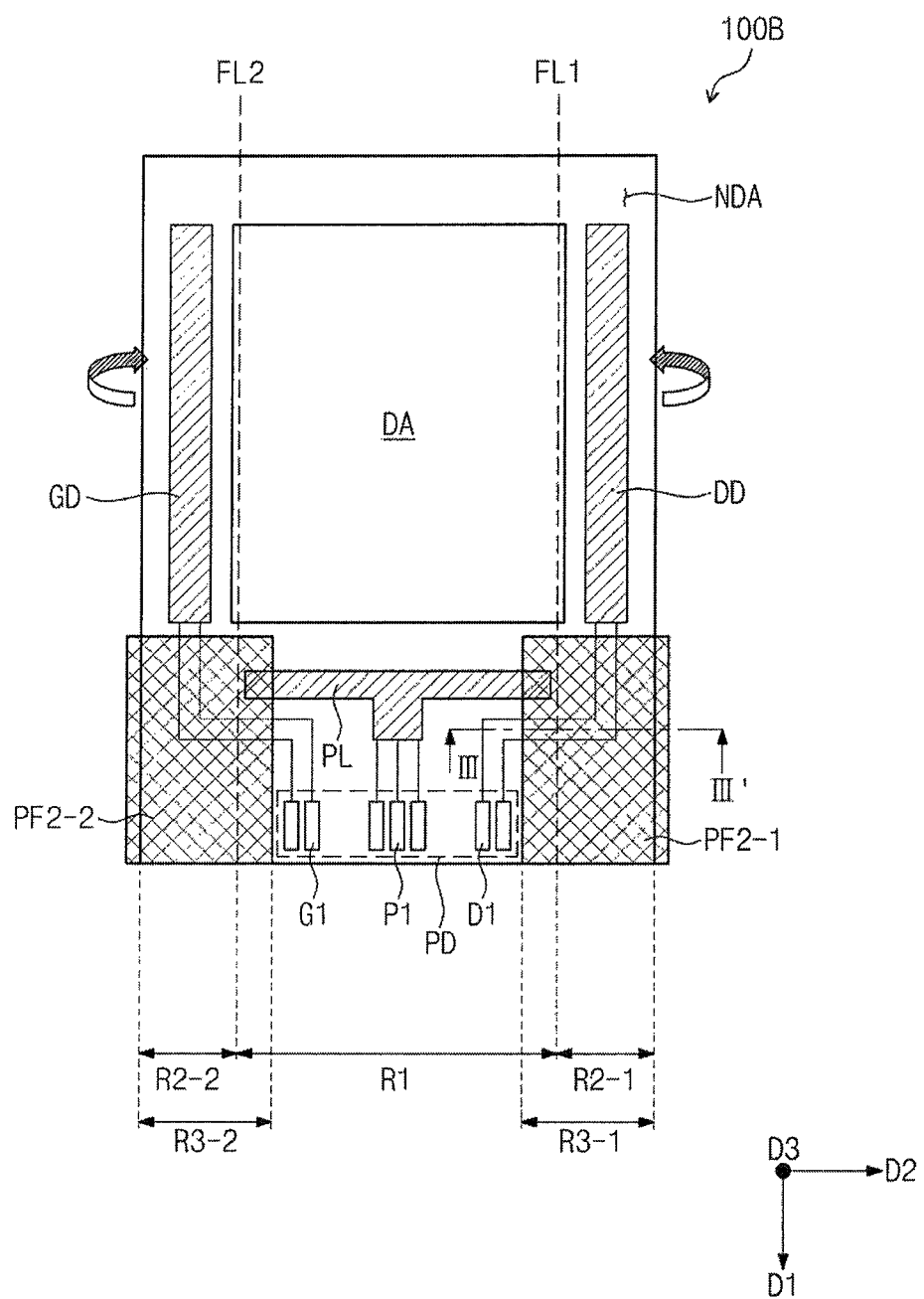
FIG. 8A is a plan view showing a display apparatus after the protective film shown in FIG. 7 is bent.
Figure 8B:
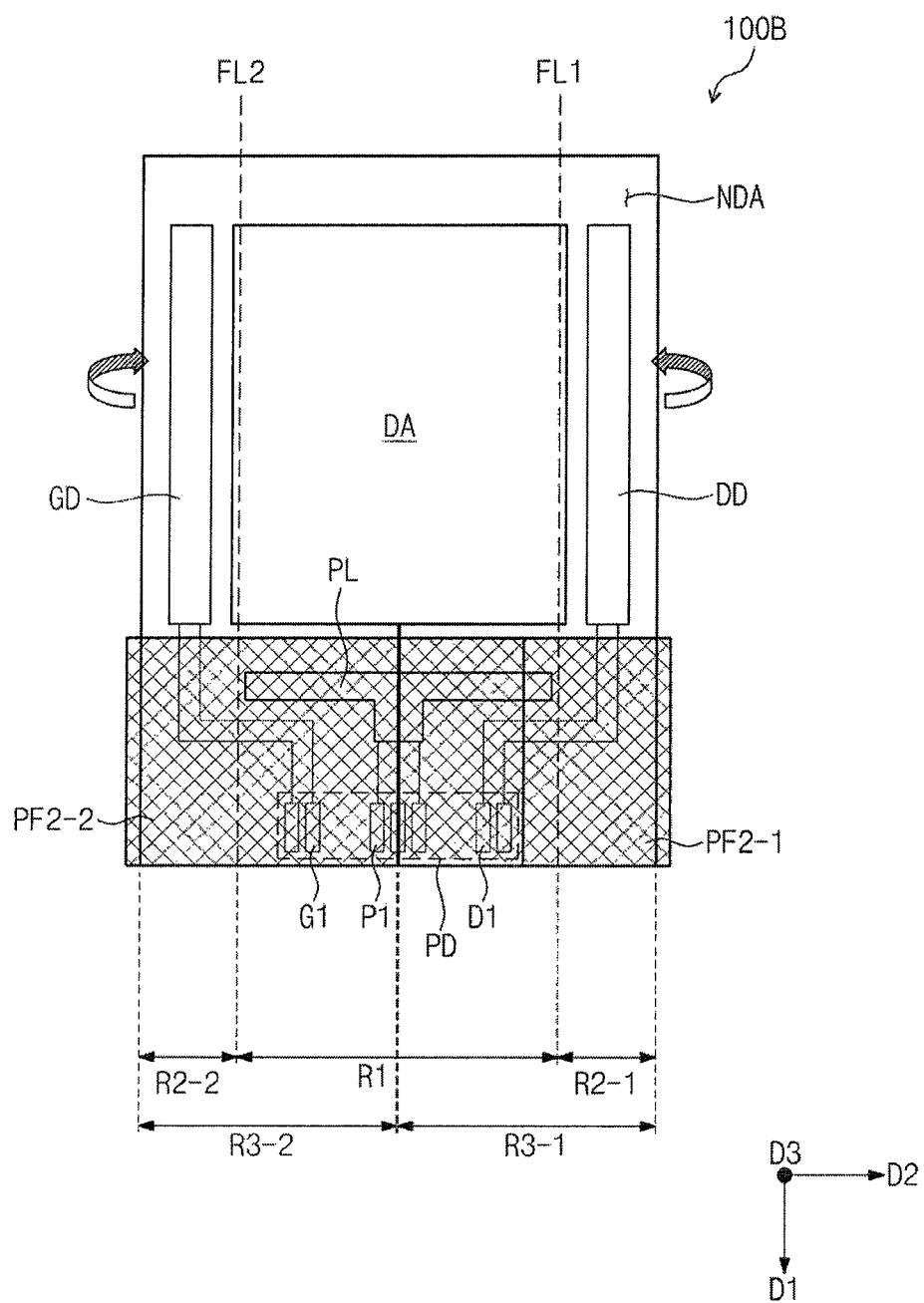
FIGS. 8B and 8C are plan views showing display apparatuses according to another example embodiment of the present disclosure.
Figure 8C:
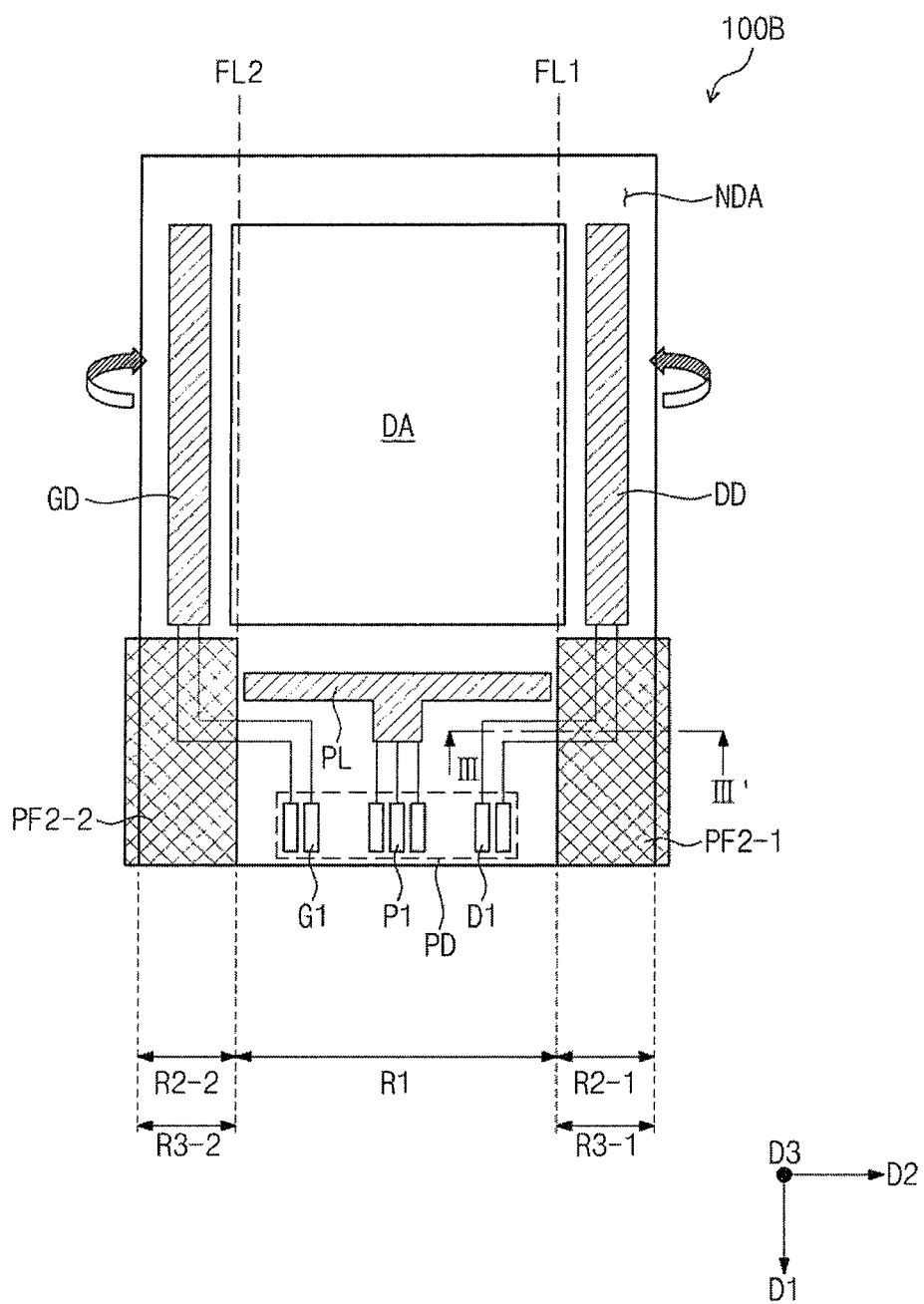
Figure 9:
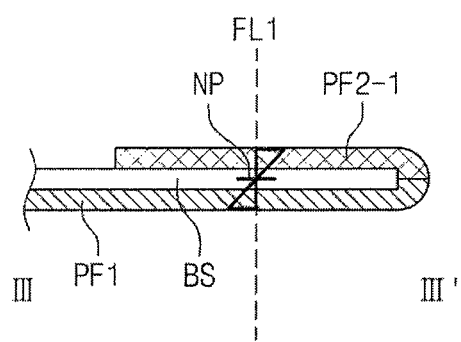
FIG. 9 is a cross-sectional view taken along the line III-III' of FIG. 8A.

FIG. 7 is a plan view showing the display apparatus before the protective film shown in FIG. 5 is bent, FIG. 8A is a plan view showing the display apparatus after the protective film shown in FIG. 7 is bent. FIGS. 8B and 8C are plan views showing display apparatuses according to example embodiments of the present disclosure and FIG. 9 is a cross-sectional view taken along the line III-III' of FIG. 8A.

Referring to FIG. 7, the protective film PF includes the first portion PF1 located under the flexible display panel DP and second portions PF2-1 and PF2-2 extending from the first portion PF1.

The second portions PF2-1 and PF2-2 include the first sub-portion PF2-1 extending in a second direction D2 from the first portion PF1 and the second sub-portion PF2-2 extending in an opposite direction to the second direction D2 from the first portion PF1 with reference to the non-display area NDA in which the signal lines and the pad part PD are located.

The second portions PF2-1 and PF2-2 are located in third regions R3-1 and R3-2 respectively adjacent to the second regions R2-1 and R2-2. The third regions R3-1 and R3-2 include a third sub-region R3-1 in which the first sub-portion PF2-1 is located and a fourth sub-region R3-2 in which the second sub-portion PF2-2 is located.

The third regions R3-1 and R3-2 have a width equal to or greater than that of the second regions R2-1 and R2-2.

As shown in FIG. 8A, the width of the third regions R3-1 and R3-2 is greater than the width of the second regions R2-1 and R2-2. The second portions PF2-1 and PF2-2 are adapted to be bent to overlap with the first and second folding lines FL1 and FL2, respectively. In this case, the pad part PD is exposed.

Referring to FIG. 8B, the second portions PF2-1 and PF2-2 are configured to be bent to the third direction D3 to overlap with the signal lines and a portion of the pad part PD, but they should not be limited thereto or thereby as long as the second portions PF2-1 and PF2-2 are configured to be bent to overlap with the first and second folding lines FL1 and FL2. The second portions PF2-1 and PF2-2 may be overlapped with the whole of the chip on film (not shown) located on the signal lines and the pad part PD.

Referring to FIG. 8C, the width of the third regions R3-1 and R3-2 may be equal to the width of the second regions R2-1 and R2-2. That is, the second portions PF2-1 and PF2-2 are configured to be bent to make contact with the first and second folding lines PL1 and PL2, and the pad part PD is exposed.

Referring to FIG. 9, the first sub-portion PF2-1 located on the base substrate BS is applied with a tensile stress, and the first portion PF1 overlapped with the first sub-portion PF2-1 while the base substrate BS is interposed therebetween is applied with a compressive stress. Because the first sub-portion PF2-1 is located on the base substrate BS, a neutral surface NP, which is not influenced by the tensile stress and the compressive stress, is located at the base substrate BS. Thus, incidences of the signal lines located on the base substrate BS being cracked may be prevented or reduced even though the base substrate BS is bent or flexed.

Figure 10:
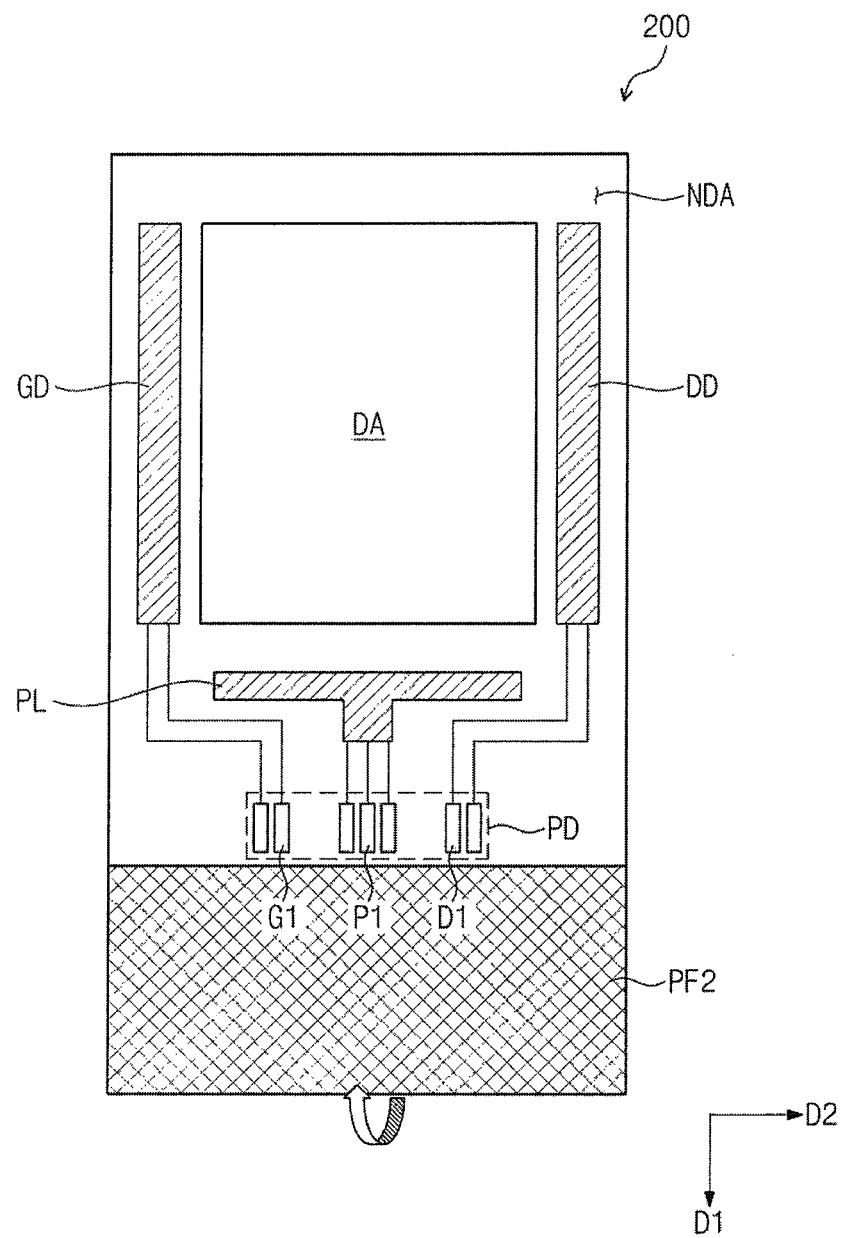
FIGS. 10 and 11 are plan views showing display apparatuses according to another example embodiment of the present disclosure.
Figure 11:
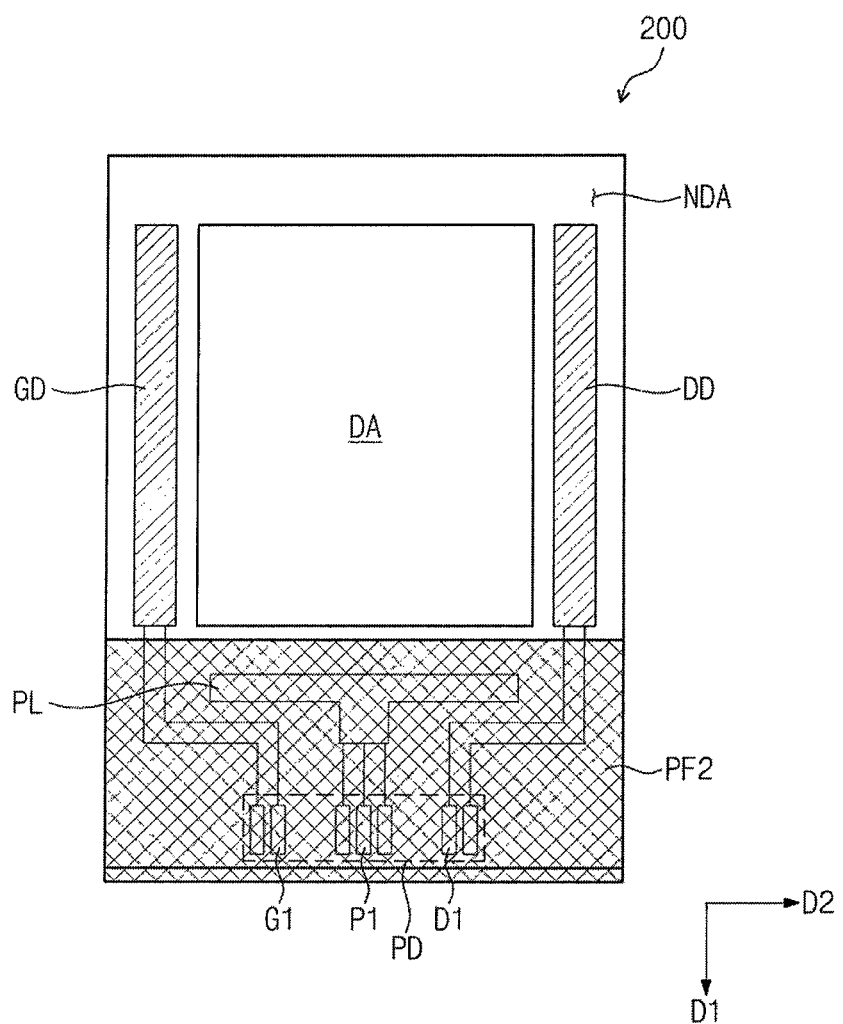

In case of the display apparatus 100B shown in FIG. 8C, the neutral surface NP is located at a position higher than a center surface of the base substrate BS. In this case, because the neutral surface NP is located inside the base substrate BS, incidences of the signal lines located on the base substrate BS being cracked may be prevented or reduced. But it should not be limited thereto or thereby, the neutral surface NP is located on the base substrate BS depending on the thickness of each of the protective film PF and the optical film OF. FIGS. 10 and 11 are plan views showing display apparatuses according to another example embodiment of the present disclosure.

For the convenience of explanation, some duplicative description of the same or similar components already described will be omitted, and some different parts from those of the above-mentioned display apparatus will be primarily described.

Referring to FIGS. 10 and 11, the protective film PF includes the first portion PF1 positioned under the flexible display panel DP and second portions PF2-1 and PF2-2 extending from the first portion PF1. The second portions PF2-1 and PF2-2 extend in a first direction D1 from the first portion PF1 and are bent with reference to the non-display area NDA in which the signal lines and the pad part PD are located. The second portions PF2-1 and PF2-2 are overlapped with the signal lines and a portion of the pad part PD, and thus instances of the signal lines being cracked may be prevented or reduced even though a display apparatus 200 is bent.

Although the example embodiments of the present invention have been described, it is understood that the present invention should not be limited to these example embodiments but various changes and modifications can be made by one ordinary skilled in the art within the spirit and scope of the present invention as hereinafter claimed, and their equivalents.

What is claimed is:

1. A display apparatus comprising:
    a flexible display panel comprising:
        a base substrate including an upper surface and a rear surface, the upper surface comprising a display area and a non-display area;
        a pixel at the display area of the upper surface of the base substrate and configured to emit light toward a viewer in a first direction; and
        signal lines at the non-display area of the upper surface of the base substrate; and
    a protective film coupled to the flexible display panel and comprising:
        a first portion under the flexible display panel and facing the rear surface of the base substrate; and
        a second portion extending from the first portion and configured to be bent to contact the upper surface of the base substrate and overlap with the signal lines, and to overlap with the first portion such that the base substrate is between the first portion and the second portion,
    wherein the display apparatus is bent, in a second direction opposite the first direction, along a folding line crossing an area of the display apparatus in which the first portion and the second portion are configured to be overlapped with each other.

2. The display apparatus of claim 1, wherein the folding line is parallel to a boundary line between the display area and the non-display area.

3. The display apparatus of claim 2, wherein the folding line crosses the display area.

4. The display apparatus of claim 2, wherein the second portion comprises a first sub-portion and a second sub-portion, wherein the first portion is between the first and second sub-portions and the first and second sub-portions are configured to cover a corresponding pad of a plurality of pads for the signal lines.

5. The display apparatus of claim 4, wherein the pads for the signal lines are gathered at one side of the non-display area.

6. The display apparatus of claim 5, wherein the flexible display panel further comprises:
   a data driver at a first side of the non-display area and configured to apply a data signal to the pixel; and
   a gate driver at a second side of the non-display area opposite the first side of the non-display area and configured to apply a driving signal to the pixel,
   wherein a first group of the signal lines is coupled to the data driver, and a second group of the signal lines is coupled to the gate driver.

7. The display apparatus of claim 1, wherein the signal lines are formed at a neutral surface where the first portion is configured to be overlapped with the second portion.

8. The display apparatus of claim 1, wherein the flexible display panel further comprises:
   a display device layer comprising the pixel and located in the display area of the base substrate; and
   an optical film on the display device layer and overlapping the display area.

9. The display apparatus of claim 8, wherein a neutral surface of the display area of the display apparatus is at the display device layer.

10. The display apparatus of claim 8, wherein the optical film comprises at least one of a retardation film or a polarizing film.

11. A display apparatus comprising:
   a flexible display panel comprising:
      a base substrate comprising a display area and a non-display area;
      a pixel at the display area of the base substrate; and
      signal lines at the non-display area of the base substrate; and
   a protective film coupled to the flexible display panel and comprising:
      a first portion under the flexible display panel; and
      a second portion extending from the first portion and configured to be bent to overlap with the signal lines and to overlap with the first portion such that the base substrate is between the first portion and the second portion,
   wherein the display apparatus is configured to be bent along a folding line crossing an area of the display apparatus in which the first portion and the second portion are configured to be overlapped with each other, and
   wherein the folding line crosses the display area.

* * * * *